(12) United States Patent
Shi et al.

(10) Patent No.: US 11,903,116 B2
(45) Date of Patent: Feb. 13, 2024

(54) CATHODE ARC SOURCE, FILTERS THEREOF AND METHOD OF FILTERING MACROPARTICLES

(71) Applicant: Nanofilm Technologies International Limited, Singapore (SG)

(72) Inventors: Xu Shi, Singapore (SG); Ming Chu Yang, Singapore (SG); Kok How Tan, Singapore (SG)

(73) Assignee: Nanofilm Technologies International Limited, Singapore (SG)

( * ) Notice: Subject to any disclaimer, the term of this patent is extended or adjusted under 35 U.S.C. 154(b) by 0 days.

(21) Appl. No.: 17/758,782

(22) PCT Filed: Jun. 18, 2021

(86) PCT No.: PCT/EP2021/066617
§ 371 (c)(1),
(2) Date: Jul. 13, 2022

(87) PCT Pub. No.: WO2021/255242
PCT Pub. Date: Dec. 23, 2021

(65) Prior Publication Data
US 2023/0137012 A1    May 4, 2023

(30) Foreign Application Priority Data
Jun. 19, 2020    (EP) .................................... 20181191

(51) Int. Cl.
*H01J 37/32* (2006.01)
*H05H 1/50* (2006.01)
(Continued)

(52) U.S. Cl.
CPC ............. *H05H 1/50* (2013.01); *C23C 14/325* (2013.01); *H01J 37/32055* (2013.01); *H01J 37/32614* (2013.01); *H01J 37/3402* (2013.01)

(58) Field of Classification Search
None
See application file for complete search history.

(56) References Cited

U.S. PATENT DOCUMENTS

| 6,027,619 A | 2/2000 | Cathey et al. |
| 7,381,311 B2 | 6/2008 | Aksenov et al. |

(Continued)

FOREIGN PATENT DOCUMENTS

| CN | 108203090 A | 6/2018 |
| JP | 2003166050 A | 6/2003 |

(Continued)

OTHER PUBLICATIONS

Kuhn M et al. Deposition of carbon films by a filtered cathodic arc. *Diamond and Related Materials*, Elsevier Science Publishers, Amsterdam, NL.

(Continued)

*Primary Examiner* — Jason Berman
(74) *Attorney, Agent, or Firm* — Sterne, Kessler, Goldstein & Fox P.L.L.C.

(57) ABSTRACT

A filter (104a, 104b, 108) for a cathode arc source comprises: a filter duct having at least one bend (104a, 104b), and a first magnetic field source for steering plasma through the filter duct for removal of macroparticles from the plasma; wherein the apparatus comprises a second magnetic field source (108) which is rotatably mounted surrounding a portion of the filter duct. Cathode arc sources (102) and cathode arc deposition apparatuses (106) comprise the filters described herein, and methods of filtering macroparticles from a beam of plasma emitted from a cathode arc source use the filters.

16 Claims, 8 Drawing Sheets

(51) Int. Cl.
  *H01J 37/34* (2006.01)
  *C23C 14/32* (2006.01)

(56) References Cited

U.S. PATENT DOCUMENTS

| | | |
|---|---|---|
| 2002/0007796 A1* | 1/2002 | Gorokhovsky ..... C23C 14/0641 |
| | | 427/580 |
| 2003/0155230 A1 | 8/2003 | Shi et al. |
| 2004/0137725 A1 | 7/2004 | Cheah et al. |
| 2007/0023282 A1* | 2/2007 | Murakami ........ H01J 37/32055 |
| | | 204/298.41 |
| 2008/0105657 A1* | 5/2008 | Wu ................... H01J 37/32055 |
| | | 219/76.16 |
| 2010/0190036 A1 | 7/2010 | Komvopoulos et al. |
| 2015/0083586 A1 | 3/2015 | Ono et al. |
| 2016/0071702 A1* | 3/2016 | Suzuki ............. H01J 37/32357 |
| | | 204/298.41 |

FOREIGN PATENT DOCUMENTS

| | | |
|---|---|---|
| JP | 2005-216575 A | 8/2005 |
| JP | 2015-159113 A | 9/2015 |
| KR | 20180066371 A | 6/2018 |
| WO | WO 96/026531 A2 | 8/1996 |
| WO | WO99/22395 A2 | 5/1999 |
| WO | WO 99/22396 A | 5/1999 |
| WO | WO 2012/044258 A1 | 5/2012 |

OTHER PUBLICATIONS

Neuville S. New application perspective for tetrahedral amorphous carbon coatings. *QScience Connect* 2014:8.

* cited by examiner

CATHODE ARC SOURCE, FILTERS THEREOF AND METHOD OF FILTERING MACROPARTICLES

INTRODUCTION

The present invention relates to improved cathode arc source filters, in particular incorporated into improved filtered cathode vacuum arc (FCVA) sources. The improved cathode arc source filters have a greater plasma transport efficiency compared to conventional filters.

BACKGROUND TO THE INVENTION

A large variety of deposition techniques are used to coat substrates. Vapor deposition technology is typically used to form thin film deposition layers in various types of applications, including microelectronic applications and heavy-duty applications.

One example of a known physical vapor deposition technique is cathodic vapor arc deposition methods. In this method, an electric arc is used to vaporize material from a cathode target. The resulting vaporized material is transported to a coating chamber where it condenses on a substrate to form a thin film of coating. Cathode arc deposition of tetrahedral amorphous carbon, metallic, dielectric and other such coatings is known in the art and offers the potential for deposition of thin films of high quality.

Apparatus and methods for filtering the plasma generated, namely to remove macroparticles generated in the vapourisation process, are known (and are commonly referred to as filtered cathode vacuum arc (FCVA) apparatuses/processes). Filters typically make use of the different mobilities of plasma and macroparticles in a magnetic field to separate the two components. The filters often comprise a duct having one or more bends or curves. The curved nature of the filter ducts (when combined with an appropriate magnetic field) means that the plasma beam can be directed along the centre of the filter duct whereas macroparticles are collected at the curved portions of the inner wall of the duct. The plasma beam is then directed to a filter outlet, which may include a baffle perforated by an aperture, which leads to a coating chamber containing one or more substrates to be coated.

Examples of filtering apparatuses include "double bend" filters and "X-bend" filters. An example of a double bend filter and an FCVA apparatus comprising a double bend filter can be found in WO 96/26532 (Avimo Group). An example of an X-bend filter and an FCVA apparatus comprising an X-bend filter can be found in US 2013/0180845 A1 (Shi et al.).

Plasma efficiency is generally improved with a centralised plasma beam. In general, If the plasma beam is not aligned with the outlet, in particular not aligned with the aperture in the filter outlet, then a smaller fraction of the plasma generated at the source will enter the coating chamber and as a result, the plasma efficiency of the device is reduced.

This problem is increased in coating apparatuses which comprise several sources, and therefore several filters. This is as a result of interference between magnetic fields of different filters affecting the plasma beams inside the filters.

There therefore exists the need for alternative filtered cathode arc coating apparatuses, preferably those which provide an increased plasma efficiency.

SUMMARY OF INVENTION

The present invention seeks to provide for alternative, and preferably improved, filtering of arc plasma and to overcome or at least ameliorate problems encountered with prior art cathode arc sources. It is therefore an object of the invention to provide an improved filter for a cathodic vacuum arc deposition apparatus which allows for greater control of the position of the plasma beam at the outlet of the filter. A further object is to improve the plasma efficiency of filtered cathodic vacuum arc (FCVA) deposition an apparatus.

Accordingly, a first aspect of the invention provides a filter for a cathode arc source,
said filter comprising:
a filter duct having at least one bend, and
a first magnetic field source for steering plasma through the filter duct for removal of macroparticles from the plasma;
wherein the apparatus comprises a second magnetic field source which is rotatably mounted surrounding a portion of the filter duct.

The strength of the second magnetic field source is typically small compared to the strength of the first magnetic field source and therefore the second magnetic field source can be used to make small and local adjustment to the magnetic field, and when used in an apparatus with multiple ducts can be used to adjust the magnetic field in the filter duct which it surrounds, without substantially affecting the magnetic field within other nearby filter ducts.

The invention also provides a cathode arc source comprising the filter. For example, the invention also provides a cathode arc source for depositing a coating on a substrate, said source comprising:
an anode and a cathode station for a target,
a filter comprising a filter duct having at least one bend, and
a first magnetic field source for steering plasma through the filter duct for removal of macroparticles from the plasma;
wherein the apparatus comprises a second magnetic field source which is rotatably mounted surrounding a portion of the filter duct.

An advantage of the apparatuses of the invention is that the plasma beam in the filter duct can be subjected to fine control and can be directed such that it exits the filter substantially centrally with respect to the outlet aperture. This improves control and enables increase in the plasma efficiency of the filter (i.e. the proportion of plasma that exits the filter).

The invention also provides a method of optimising the plasma efficiency of a cathode arc deposition apparatus comprising multiple (e.g. two or more; especially, two, four or six) sources each having a duct and hence a filter as described herein, the method comprising sequentially adjusting the position (e.g. the rotational position) of the second magnetic field sources on each of the filters to optimise the plasma efficiencies of the filters.

Also provided is a method of filtering macroparticles from a beam of plasma emitted from a cathode arc source, the method comprising:
steering the plasma beam through a filter comprising a filter duct and a first magnetic field source for directing the plasma beam through the duct; and
applying a second magnetic field to the plasma beam to adjust the position of the plasma beam at the outlet of the filter. Very suitably, the method comprises applying the second magnetic field via a second magnetic field source which is rotatably mounted and surrounding a portion of the filter duct.

Details of the Invention

The filter comprises a filter duct having at least one bend. In some embodiments, the filter has two bends wherein each bend generally has an angle of less than 90° and more commonly less than 60°. Such filters may commonly be referred to as "double bend" filters. Preferably, when two bends are present, each bend is in a different plane. Alternatively, the filter duct may comprise one sharp bend having an angle of more than 90°. Examples of such filters include "X-bend" filters, and may further comprise a second bend, typically of less than 45°. The bend angles used herein refer to the angle about which a particle travelling through the filter duct must turn in order to pass through the filter duct (rather than the angle between two arms of the filter duct). The duct preferably has a single inlet and a single outlet and therefore there is a single pathway through the duct along which plasma/particles can travel.

Accordingly, the filter may be a double bend filter or an X-bend filter. The filter ducts typically have an external diameter of from 15 cm to 30 cm.

The filter duct is provided with a first magnetic field source for steering the plasma beam around the bend(s) in the filter duct. The first magnetic field source preferably comprises a coil of a conducting material wrapped around the filter duct along the majority of its length or substantially its entire length. For example, the first magnetic field source may comprise a coil of a conducting material wrapped around the filter duct along 50% of greater of its length, typically along 75% or greater of its length, for example 90% or greater of its length.

The first magnetic field source typically provides a magnetic field strength (when measured at the centre of the filter duct) of 15 mT or greater, such as 20 mT or greater. The magnetic field strength does not typically exceed 40 mT, and preferably does not exceed 35 mT or 30 mT. For example, the first magnetic field source may provide a magnetic field strength of from 15 mT to 40 mT, preferably from 20 mT to 35 mT or from 20 mT to 30 mT.

In use, plasma containing positive ions, and being contaminated by macroparticles and/or neutral atoms, is generated in a cathode arc source. A plasma beam containing the macroparticle/neutral atom contaminants exits the cathode arc source and is steered around a bend of the filter and a proportion of macroparticles/neutral atoms hit the side of the filter duct and are removed from the plasma beam. At the end of the duct closest to the substrate(s) to be coated, that is to say after the plasma has passed through the bend(s), the plasma has been filtered with reduced contamination and a there is a relatively high density of any remaining macroparticles and neutral atoms towards the outside of the duct. The plasma is denser in terms of positive ions towards the centre of the duct. The plasma may be substantially free of contaminants.

At its outlet, the filter may comprise a baffle in the form of a disc having a substantially circular aperture, which helps ensure that only plasma (and not macroparticles and neutral atoms) may exit the filter and enter the coating chamber. The aperture shape may additionally be at least partially dictated by the cross-section of the filter duct. If this is not circular but oval-shaped, then an oval-shaped aperture or an aperture varying from circular may be appropriate.

The disc typically extends across the width of the filter duct. Macroparticles that hit the disc fall back onto the side of the duct away from the aperture which leads to the coating chamber. After a period of use, it will be preferred to clean the duct and/or the disc in this area, though a major part of the filtering is achieved by the first bend of the duct and consequently cleaning of the disc will not often be necessary.

As plasma density generally increases towards the centre of the duct only a small proportion of plasma is blocked by the action of the disc. Nevertheless, to minimise the amount of plasma that is blocked by the disc, the plasma beam should be aligned with respect to the aperture in the disc. In order to achieve this, the apparatus of the invention comprises a second magnetic field source which is rotatably mounted surrounding a portion of the filter duct. Rotational movement of the second magnetic field enables fine adjustment of the plasma beam within the duct, e.g. enables centralising of the beam.

The second magnetic field source is typically annular in shape and completely surrounds a portion of the filter duct.

When the second magnetic field source is annular in shape, it may have a thickness of from 20 mm to 50 mm, for example from 30 mm to 40 mm. The thickness of an annular object (in the context of the present specification) refers to the depth of the object along an axis perpendicular to the plane in which the aperture lies.

The annular second magnetic field source typically has an inner diameter (i.e. the diameter of the hole in the centre of the annular source) of from 300 mm to 400 mm and an outer diameter (i.e. the diameter of the annular source as a whole) of from 400 mm to 500 mm. The inner diameter of the second magnetic field source will, of course, be greater than the diameter of the filter duct so that the second magnetic field source can be rotated about the filter duct. Typically, the second magnetic field source has a clearance of from greater than 2 cm, for example greater than 4 cm, preferably greater than 6 cm—the clearance being defined as the distance between the filter duct and the second magnetic field source when both are coaxially aligned.

The second magnetic field source may take the form of a magnetic field generating coil (i.e. a coil of an electrically conducting material, such as copper, which generates a magnetic field when an electric current is passed therethrough) or one or more permanent magnets. The second magnetic field is generally an electromagnet, and typically connected to the same power supply as the first magnetic field source. When the second magnetic field source is a permanent magnet or an array of permanent magnets, the magnets may be selected from ferrite magnets, alnico magnets, neodymium magnets, cobalt magnets and mixtures thereof.

The second magnetic field source may provide a second magnetic field having a strength of less than 20 mT, typically less than 15 mT, preferably less than 10 mT, most preferably less than 8 mT. The strength of the second magnetic field is however typically greater than 2 mT, preferably greater than 3 mT. For example, the strength of the second magnetic field may be from 2 mT to 20 mT, typically from 2 mT to 18 mT, for example 3 mT to 15 mT and preferably from 3 mT to 10 mT or 3 mT to 8 mT.

The strength of the second magnetic field is preferably significantly less than the strength of the first magnetic field. For example, the second magnetic field source may provide a magnetic field of strength of from 15% to 50%, typically 20% to 35%, such as from 20% to 25% of the strength of the first magnetic field.

When the second magnetic field source is a coil (e.g. a coil made from copper and having a diameter of approximately 350 mm) an appropriate magnetic field strength can be generated by passing a current of from 12 A to 22 A, preferably from 14 A to 20 A through the coil.

In use, deposition chambers may have multiple sources attached, each with separate filters. As the strength of the second magnetic field source is typically small compared to the strength of the first magnetic field source, the second magnetic field source can be used to adjust the magnetic field in the filter duct which it surrounds, without substantially affecting the magnetic field within other nearby filter ducts.

The second magnetic field source is mounted surrounding a portion of the filter. When the filter duct comprises two bends (e.g. two bends each of less than 90°), the second magnetic field source may be located between the two bends.

When the filter duct comprises a bend of greater than 90°, for example in a device of the X-bend type, the second magnetic field source may be located upstream (i.e. between the greater than 90° bend and the inlet of the filter duct, which is connected to the cathode arc source) or downstream of that bend (i.e. between the greater than 90° bend and the outlet of the filter duct, which is connected to the coating chamber).

In certain arrangements, the filter duct comprises at least one bend and the second magnetic field source is positioned upstream (i.e. closer to the plasma source) of the at least one bend.

Alternatively, the filter duct comprises at least one bend and the second magnetic field source is positioned downstream of the at least one bend.

The second magnetic field source is mounted to the exterior of the filter duct in a rotatable manner. With the strength of the second magnetic field source being fixed (either by virtue of the second magnetic field source being a permanent magnet or by use of a constant current when the second magnetic field source is a coil), the magnetic field within the filter can be adjusted by adjusting the position, i.e. the rotation, of the second magnetic field source. Adjusting the magnetic field within the filter in this way can adjust the point at which the plasma beam exits the filter.

The second magnetic field source may be mounted to the exterior of the filter duct by means of a bracket. When the second magnetic field source is annular in shape, the bracket may hold the annular magnetic field source so that it is co-axially aligned with the portion of the filter duct that it surrounds.

The second magnetic field source is rotatably mounted surrounding the filter duct. The second magnetic field source is preferably mounted on the filter duct in a manner that allows it to be rotated about an axis perpendicular to the axis of the filter duct at the portion of the filter duct where the second magnetic field source surrounds the filter duct. Preferably the second magnetic field source is independently rotatable in two directions to allow for the position of the plasma beam at the filter outlet to be adjusted both vertically and horizontally. For example, the second magnetic field source may be independently rotatable in about two orthogonal axes, both of which are perpendicular to the axis of the filter duct at the portion of the filter duct where the second magnetic field source surrounds the filter duct. In other words, the second magnetic field source may be mounted on the filter duct in a manner that allows it to be rotated independently about two axes perpendicular to the axis of the filter duct at the portion of the filter duct where the second magnetic field source surrounds the filter duct.

The second magnetic field source may be pivotably mounted to a support ring, which allows the second magnetic field to rotate about a first axis passing through the centre of the second magnetic field source. The support ring may be pivotably mounted onto the filter duct (e.g. through a bracket) to allow the support ring (and the connected second magnetic field source) to rotate about a second axis passing through the centre of the second magnetic field source. As mentioned above, preferably, the first and second axes are orthogonal (i.e. perpendicular) to each other to allow the second magnetic field source to be rotated in two perpendicular axes.

Other optional features of the filter are described below.

As described above, the filter is commonly provided with a disc-shaped baffle having an aperture at its outlet. In an embodiment, the disc is a substantially planar and circular disc of steel foil with a central aperture. Generally, the disc should be thin and should not interfere with the operation of the filter duct and should not interfere with the magnetic field that steers plasma through the filter duct. Typically, the disc is less than 2 mm thick, and is preferably less than 1 mm thick.

The aperture in the disc is for passage of plasma therethrough and may have a width from 10% to 50% the internal width of the filter duct, preferably from 25% to 40% the width of the filter duct at that point. The aperture will be designed according to its particular application and different sizes may be appropriate according to the position of the filter, the size of the filter duct and the type of material that is being laid down in a coating if the radius of the first bend of the filer duct is sharp the density of macroparticles towards the outside of the duct may be higher, as macroparticles are not bent around the bend by the magnetic steering field, in which case a smaller baffle and a larger aperture may be suitable. Rotational movement of the second magnetic field source may be used to align the beam with the aperture.

The filter may also comprise a shutter associated with the aperture for opening and closing of the aperture. Operation of the shutter between a closed and an open position respectively stops and starts deposition during use of the cathode arc source. Deposition can be stopped and started at precise times, and rapidly. To avoid deposition during the period immediately after arc striking the shutter can be closed initially and then opened after plasma quality has reached a predetermined level or after a predetermined time. This feature of the invention can thus offer improved control over the deposition process.

The shutter is optionally controlled manually by handle means extending from the shutter outside the filter duct. The shutter may also be controlled by an actuator in operative combination with controlling circuitry of the cathode source and adapted to close the shutter in response to certain predetermined states of the arc. One such state may be a drop in plasma quality. Another may be a drop in plasma density.

The invention also provides a cathode arc source comprising a filter described above.

For example, the invention provides a cathodic vacuum arc deposition apparatus comprising two or more (e.g. two, four or six) cathode arc sources as defined above.

In addition, the invention also provides a cathode arc source for depositing a coating on a substrate, said source comprising:
an anode and a cathode station for a target,
a filter comprising a filter duct having at least one bend, and a first magnetic field source for steering plasma through the filter duct for removal of macroparticles from the plasma;
wherein the apparatus comprises a second magnetic field source which is rotatably mounted surrounding a portion of the filter duct.

In an embodiment of the invention, the cathode arc source further comprises a third magnetic field source for scanning the plasma beam over a coating area greater than the area of the plasma beam. Typically, scanning occurs downstream of the filter duct, after exit of plasm therefrom.

The cathode arc sources, which comprise the filters described herein, may form part of a cathode arc deposition apparatus. The cathode arc deposition apparatus may comprise one or more, preferably two or more (for example two, four or six) cathode arc sources comprising filters described herein. When more than one filter as described herein is present, the rotational configurations of the second magnetic field sources of each of the filter ducts are independently adjustable. In other words, the orientation of each of the second magnetic field sources can be independently changed.

Independent adjustment allows the plasma efficiency of each filter to be optimised without affecting the plasma efficiency of another filter which forms part of the system. Independent adjustment allows adjustment in concert of plasma beams from all ducts.

In a further aspect, the invention provides a method of optimising the plasma efficiency of a cathode arc deposition apparatus comprising multiple (e.g. two, four or six) filters as described herein, the method comprising sequentially adjusting the rotational position of the second magnetic field sources on each of the filters to optimise the plasma efficiencies of the filters. The method may be iterative. Preferably, the method involves only optimising the plasma efficiency of each filter once. This is a result of the second magnetic field sources generating a relatively low magnetic field and therefore not significantly affecting the resultant magnetic field in an adjacent filter.

The deposition apparatuses use the filtered cathodic arc source (i.e. the cathode arc source comprising a filter described herein) for continuous coating of one or a plurality of substrates with positive ions from a target at the cathode of the cathode arc source.

The substrates are optionally electrically biased with a DC or RF system that confers an acceleration potential for the discharged ions emerging from the FCA source.

A particularly preferred filtered cathodic arc source for use in the apparatus of the invention is described and claimed in a co-pending International patent application Publication No. WO 96/26531.

Also provided herein is a method of filtering macroparticles from a beam of plasma emitted from a cathode arc source, the method comprising:
  steering the plasma beam through a filter comprising a filter duct and a first magnetic field source for directing the plasma beam through the duct; and
  applying a second magnetic field to the plasma beam to adjust the position of the plasma beam at the outlet of the filter.

The filter, filter duct and first and second magnetic fields suitably have the features described herein.

BRIEF DESCRIPTION OF THE DRAWINGS

FIG. 10 a graph that shows how the effect of the current through a coil acting as a second magnetic field source affects the accumulated thickness of a material deposited on a substrate.

EXAMPLES

The invention is now illustrated in the following examples.

Figure 1:
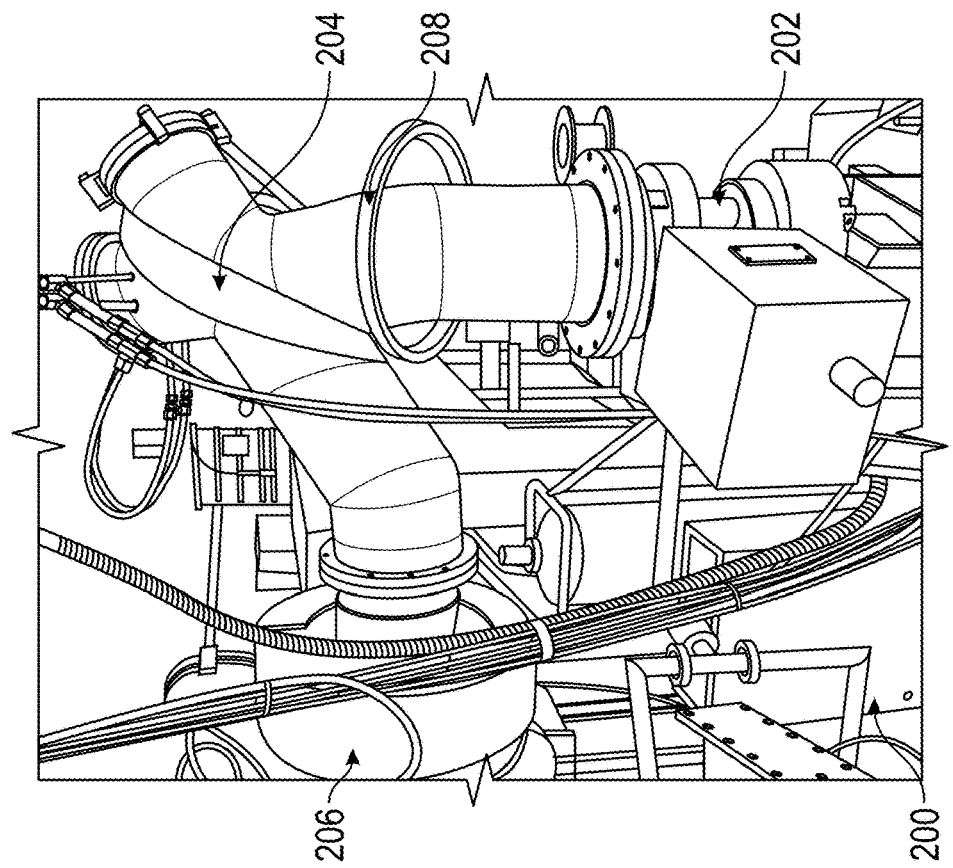
FIG. 1 shows a first embodiment of the invention which comprises a conventional FCVA apparatus with a "double bend" filter fitted with adjustment coil.
Figure 2:
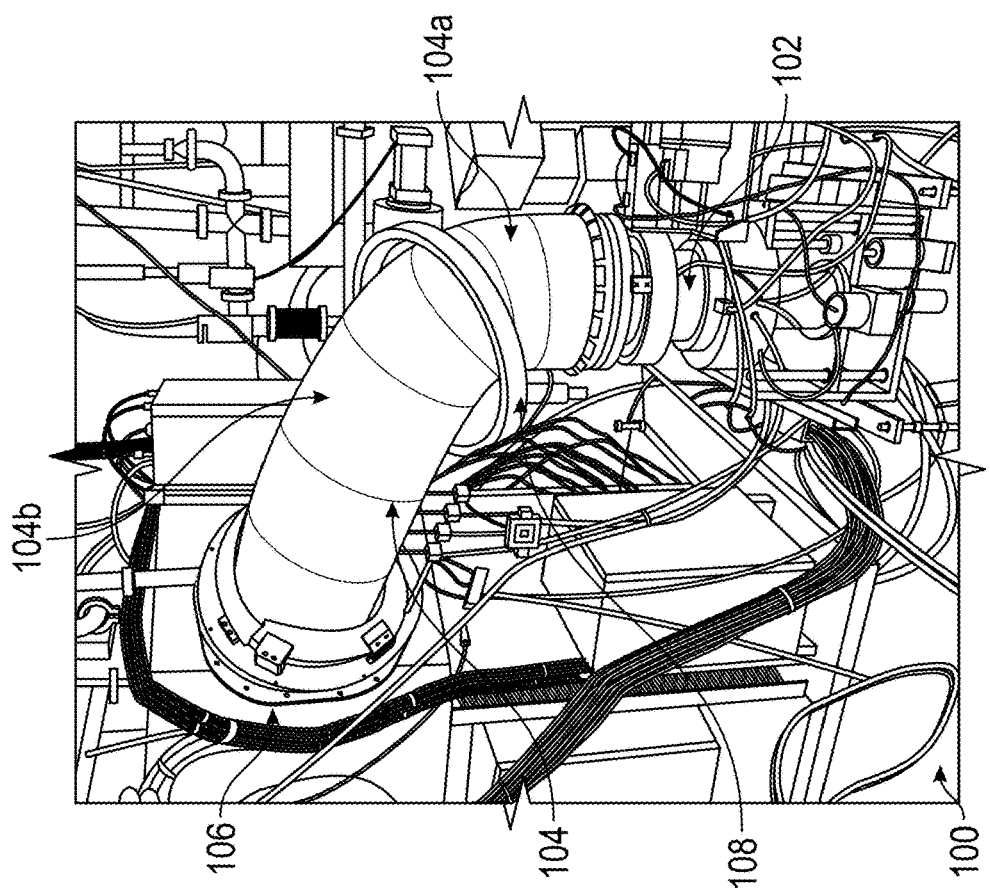
FIG. 2 shows a second embodiment of the invention which comprises a conventional FCVA apparatus with an "X-bend" filter fitted with adjustment coil.

FIGS. 1 and 2 show conventional filtered cathodic vacuum arc (FCVA) deposition apparatuses fitted with an adjustment coil.

FIG. 1 shows an FCVA apparatus (100) fitted with a double-bend filter. The apparatus (100) comprises a cathode arc source (102) in which an electric arc is used to vapourise material from a cathode target in order to generate a plasma of the vapourised target material. The plasma is formed into a beam (using magnetic fields) and this plasma beam is then directed to a coating chamber (106) via a filter duct (104).

Each filtered cathode arc source has a water-cooled anode and a water-cooled cathode, and also water cooling for the coils providing magnetic steering fields for the double bends. Each filtered cathode arc source can operate continuously, i.e. until the cathode target is substantially consumed.

The cathode arc source (102) is attached to the coating chamber (106) via a filter duct (104). The filter duct filters macroparticles from the plasma beam. In FIG. 1, the filter duct is approximately 6 inches (15 cm) in diameter and has two bends/curves (104a, 104b) in two different planes.

The first bend (104a) has an angle of 50 degrees and the second bend (104b) has an angle of 60 degrees. These two bends are in different planes, such that the resultant angle between (i) plasma entering the duct and passing through the first straight section and (ii) plasma passing through the third straight section and exiting the duct is 90 degrees.

The filter duct (104) is subjected to a magnetic steering field provided by coil windings around the duct to steer positive ions through the duct.

Figure 4B:
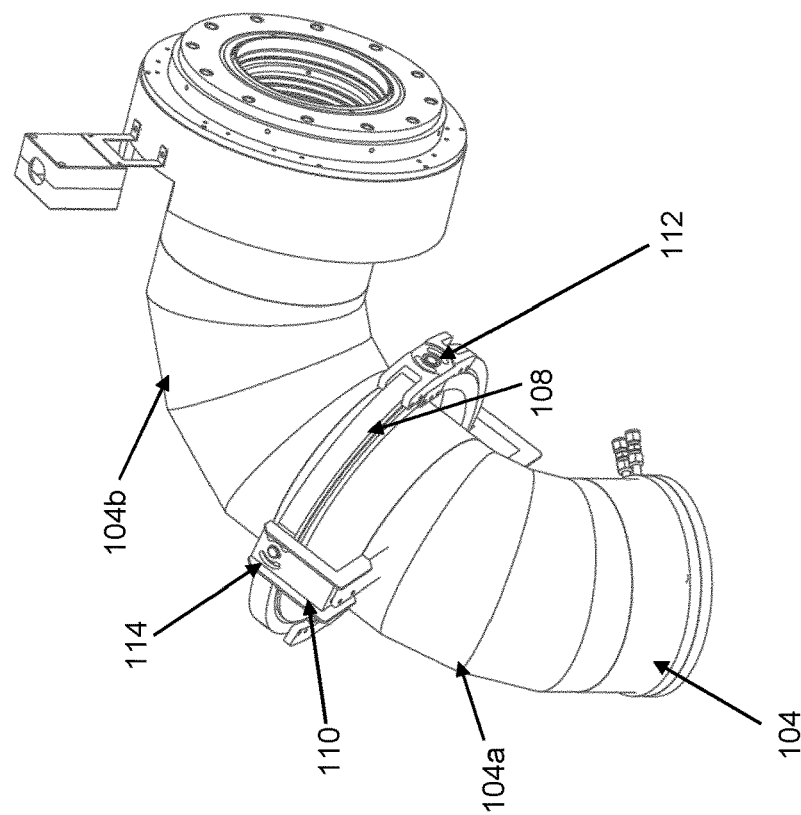
FIGS. 4A and 4B are drawings showing a double bend filter according to a further embodiment of the invention.
Figure 4A:
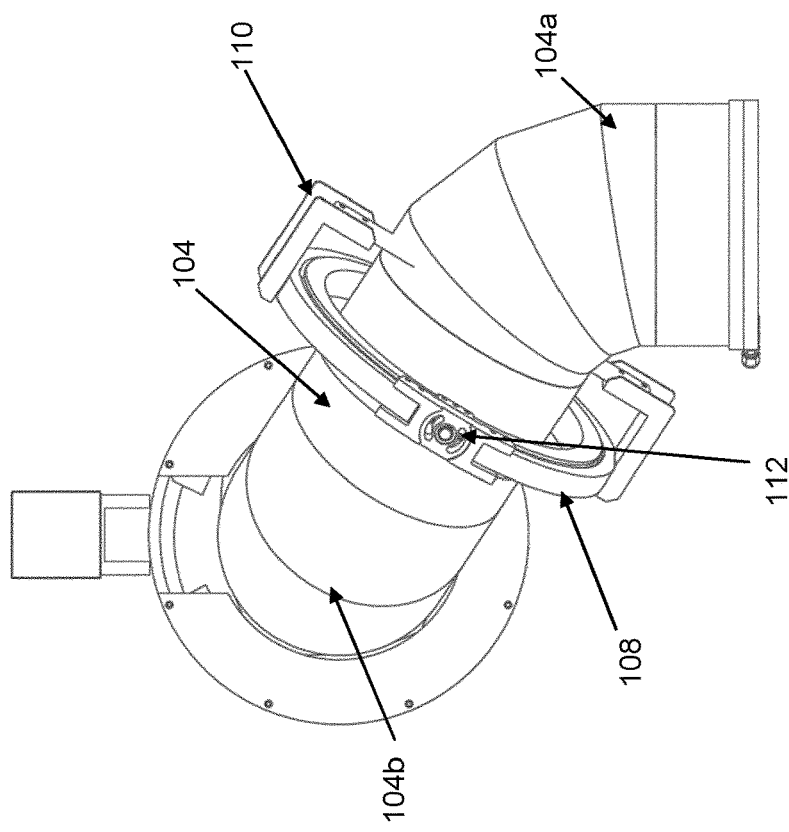
Figure 5:
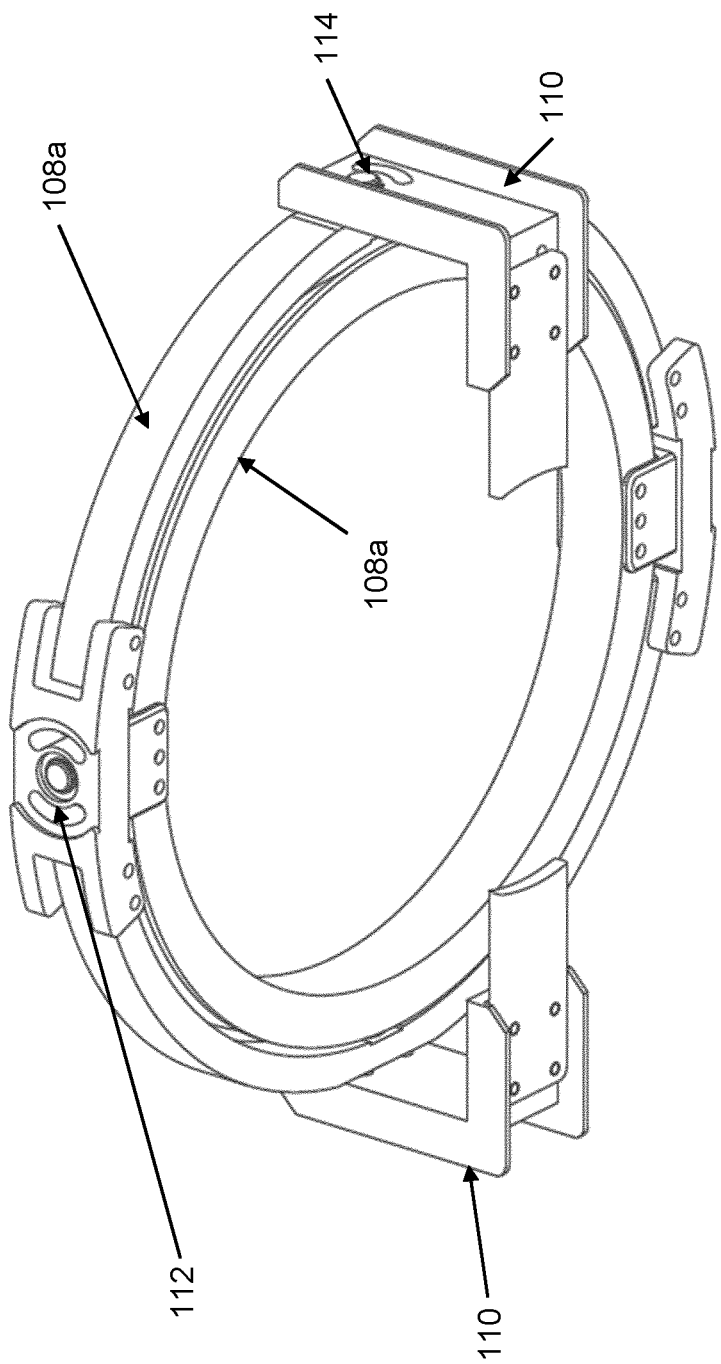
FIG. 5 is a drawing showing the second magnetic field source of the embodiment of the invention shown in FIGS. 4A and 4B.

Mounted around a portion of the filter duct (104) is an adjustment coil (108). The adjustment coil (108) and its mounting on a double bend filter duct (104) are shown more clearly in FIGS. 4A and 4B and the structure of the adjustment coil (108) itself is shown in more detail in FIG. 5.

The adjustment coil (108) takes the form of a 2 axis gimbal comprising a pair of concentric rings (108a, 108b). The inner ring (108a) is provided with a groove/channel and has wrapped around it a coil of copper wire. The inner ring is rotatably secured to the outer ring (108b) at diametrically opposite positions by two first rotating fixings (112). The outer ring (108b) is rotatably mounted to a pair of L-shaped brackets (110). One end the L-shaped brackets (110) are secured to small plates protruding perpendicularly from the outer surface of the filter duct (104). At the other end, the brackets (110) are rotatably connected to the outer ring (108b) at diametrically opposite positions by two second rotating fixings (114). The fixings that allow rotation of the inner and outer ring (112) are positioned at 90° (around the outer ring) from the fixings that allow rotation of the outer ring and brackets (114). This allows the adjustment coil to be rotatable about two orthogonal axes.

The coating chamber (106) comprises a housing which is connected to a suitable vacuum pumping system. The vacuum pumping system includes a suitable vacuum pump or combinations thereof for exhausting and pumping down the vacuum chamber to a vacuum of at least $10^{-6}$ Torr and a mechanical pump for vacuum regeneration, as is conventional with vacuum chambers. The chamber is mounted on a frame comprising a rack for instruments and a control panel having electrical connections to sensors in and around the chamber to monitor chamber pressure, arc power supply, drum motor power supply and deposition rate. The coating chamber (106) also includes a cage-like drum which is mounted for rotation about a shaft and has a cylindrical side which is adapted for mounting substrates of various configurations.

The substrates can be mounted directly on the drum acing outwardly toward the inlet in the coating chamber which is connected to the filter duct (104).

The drum is electrically insulated from the chamber and the apparatus allows the operator the option of applying a DC bias or an RF bias to the drum. The apparatus allows a bias of up to 1000 volts to be applied to the drum, applied through the drum shaft.

In use, the filtered cathode arc sources can be used simultaneously to obtain high deposition rates of diamond-like carbon films having low macroparticle counts. While the deposition apparatus of this specific embodiment uses six filtered cathode arc sources, it would be a matter of routine for a person of skill in the art to prepare apparatus having only one, or two or more than two filtered cathode arc sources. Of practical concern, an additional source can be located on the door of the vacuum chamber.

FIG. 2 shows a conventional FCVA deposition apparatus with an "X-bend" filter (as opposed to the "double bend" filter shown in FIG. 1). As for the apparatus shown in FIG. 1 (100), the apparatus in FIG. 2 (200) comprises a cathode arc source (202) and a coating chamber (206). The cathode arc source (202) and coating chamber (206) are connected by an X-bend filter duct (204) which has mounted upstream (i.e. closer to the cathode arc source (202)) of the bend an adjustment coil (208).

The functioning of the FCVA apparatus in FIG. 2 (200) is the same as that in FIG. 1 (100), the only difference being the shape of the filter duct (104, 204). Likewise, the structure and function of the adjustment coil (208) are the same as in FIG. 1 (108).

Figure 3:
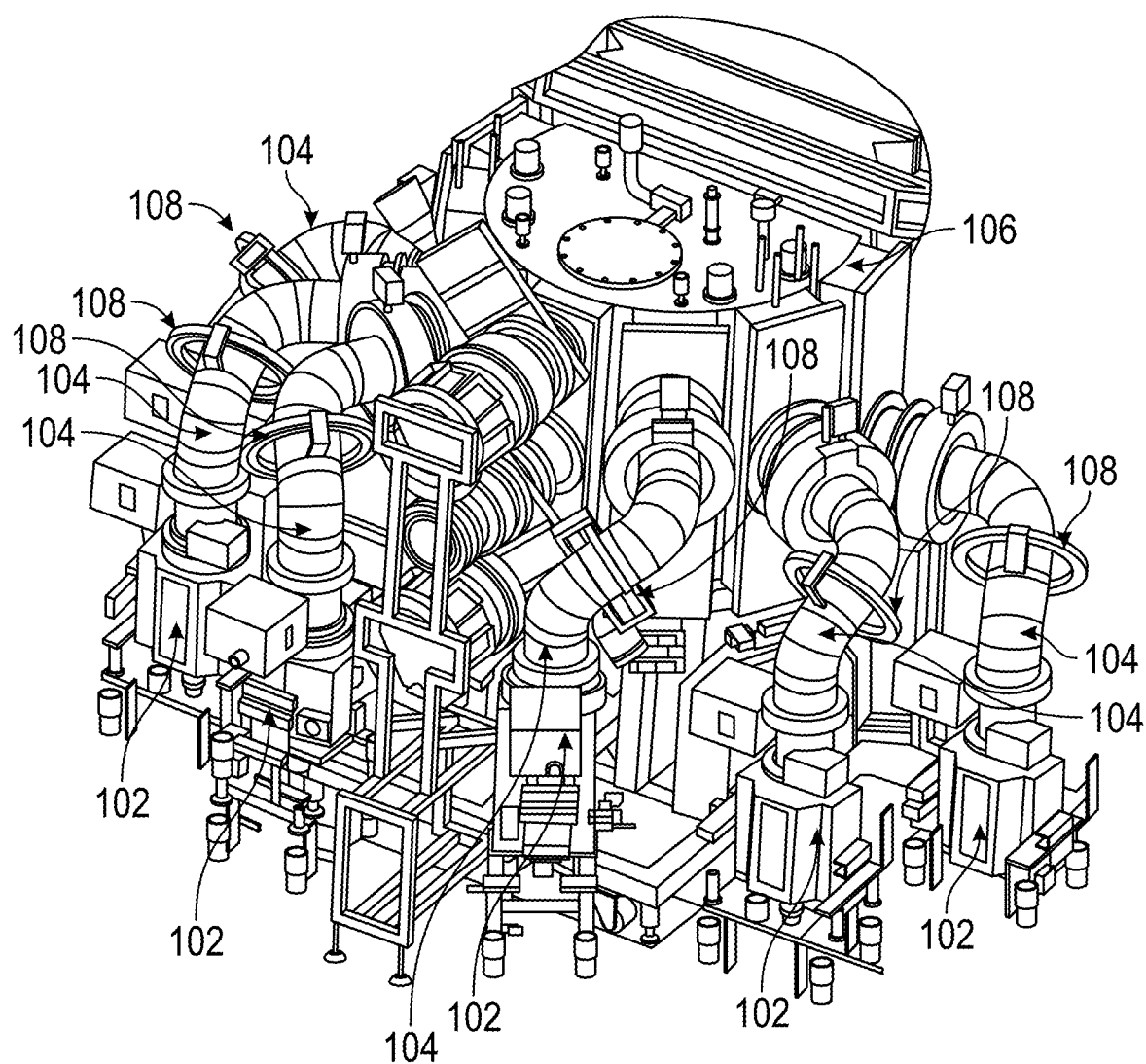
FIG. 3 shows a third embodiment of the invention which comprises a conventional FCVA apparatus having six cathode arc source each connected to a "double bend" filter, wherein each "double bend" filter is fitted with an adjustment coil.

FIG. 3 shows an FCVA apparatus which comprises multiple (specifically, six) cathode arc sources (102) and double bend filter ducts (104) all connected to a single coating chamber (106). Each filter duct (104) is provided with an adjustment coil (108) as described above.

It has been found that the addition of an adjustment coil to the filter ducts can be used to adjust the position of the plasma beam at the outlet of the filter duct. As the filter duct is usually provided with an aperture/shutter at its outlet to ensure that only the plasma beam (and not the macroparticles) enter the coating chamber, it is important to ensure that the centre of the plasma beam is aligned with the centre of the aperture/shutter to ensure that a maximum amount of plasma enters the coating chamber (to increase the plasma efficiency of the filter and of the apparatus as a whole).

Figure 6B:
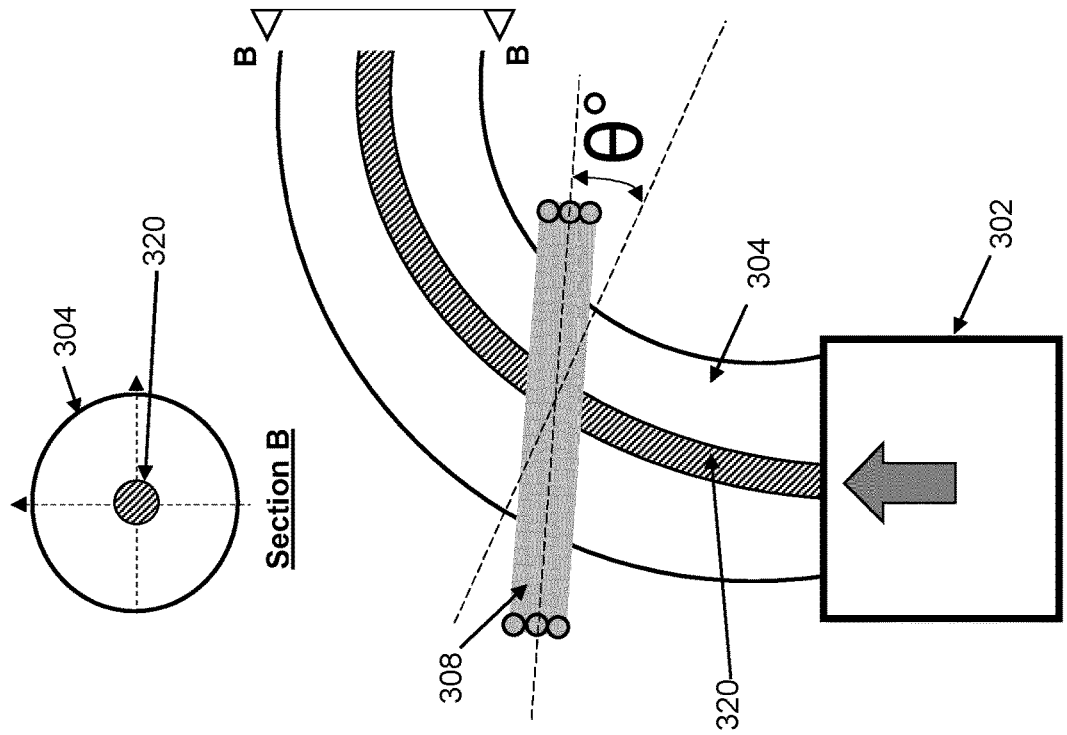
FIGS. 6A and 6B are schematic drawings showing the effect of the second magnetic field source on the position of the plasma beam at the filter outlet
Figure 6A:
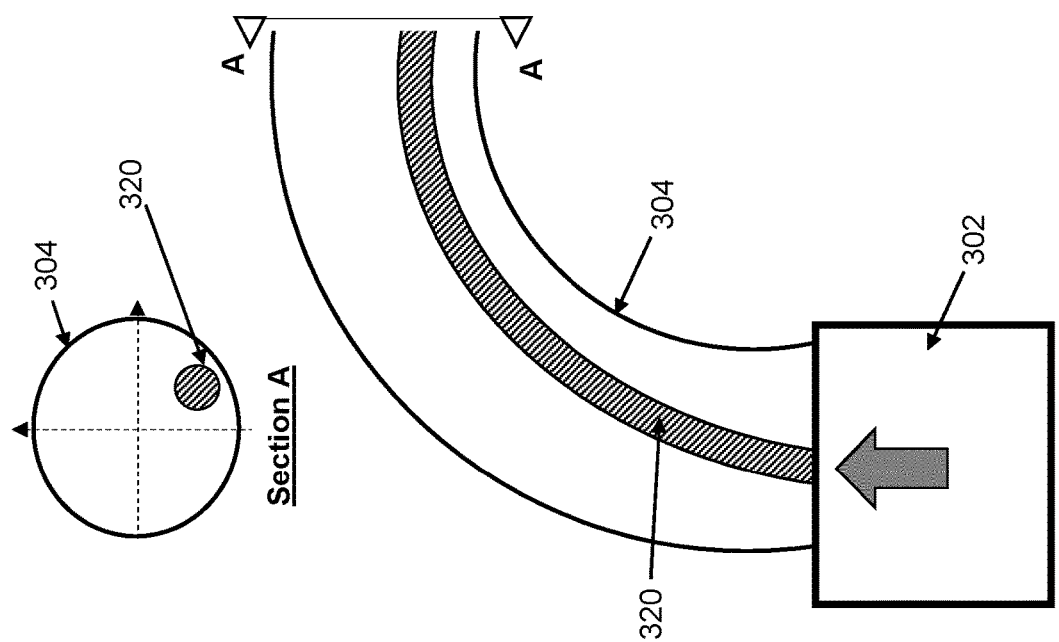

FIGS. 6A and 6B show the effect of the adjustment coil (308) on the position of the plasma beam (320) at the outlet of the filter duct (304). In FIGS. 6A and 6B, plasma is generated in a cathode arc source (302) and directed into a filter duct (304). The filter duct (304) is surrounded by a steering coil (not shown) along its entire length which steers the plasma beam (320) through the filter duct (304). Despite the presence of the steering coil, the plasma beam (320) may not always exit the filter duct (304) at a central position—see Section A in FIG. 6A. This is particularly the case for deposition apparatuses with multiple cathode arc sources and multiple filter ducts (as shown in FIG. 3) where steering magnetic fields from adjacent filter ducts may interfere with each other.

The adjustment coil (308) provides an additional, secondary magnetic field which can be used to adjust the exit position of the plasma beam (320). As the strength of the magnetic field arising from the adjustment coil is small compared to the strength of the steering magnetic field (approximately ¼ of the strength), the magnetic field arising from the adjustment coil surrounding a filter duct does not significantly affect the magnetic field in an adjacent filter duct. The table below shows the strength of the magnetic field produced by the steering coil and the adjustment coil when both coils are connected to a 14 A or 20 A current supply.

|  | Magnetic Field Strength | |
| --- | --- | --- |
| Location | 14A | 20A |
| Filter/Steering Coil | 237 Gauss (23.7 mT) | 269 Gauss (26.9 mT) |
| Adjustment Coil | 48 Gauss (4.8 mT) | 68 Gauss (6.8 mT) |

Accordingly, the adjustment coil and plasma beam exit position can be adjusted and optimised for each filter duct without having an effect on the magnetic field at another filter duct (and therefore without having an effect on the exit position of a plasma beam in another duct).

Figure 7:
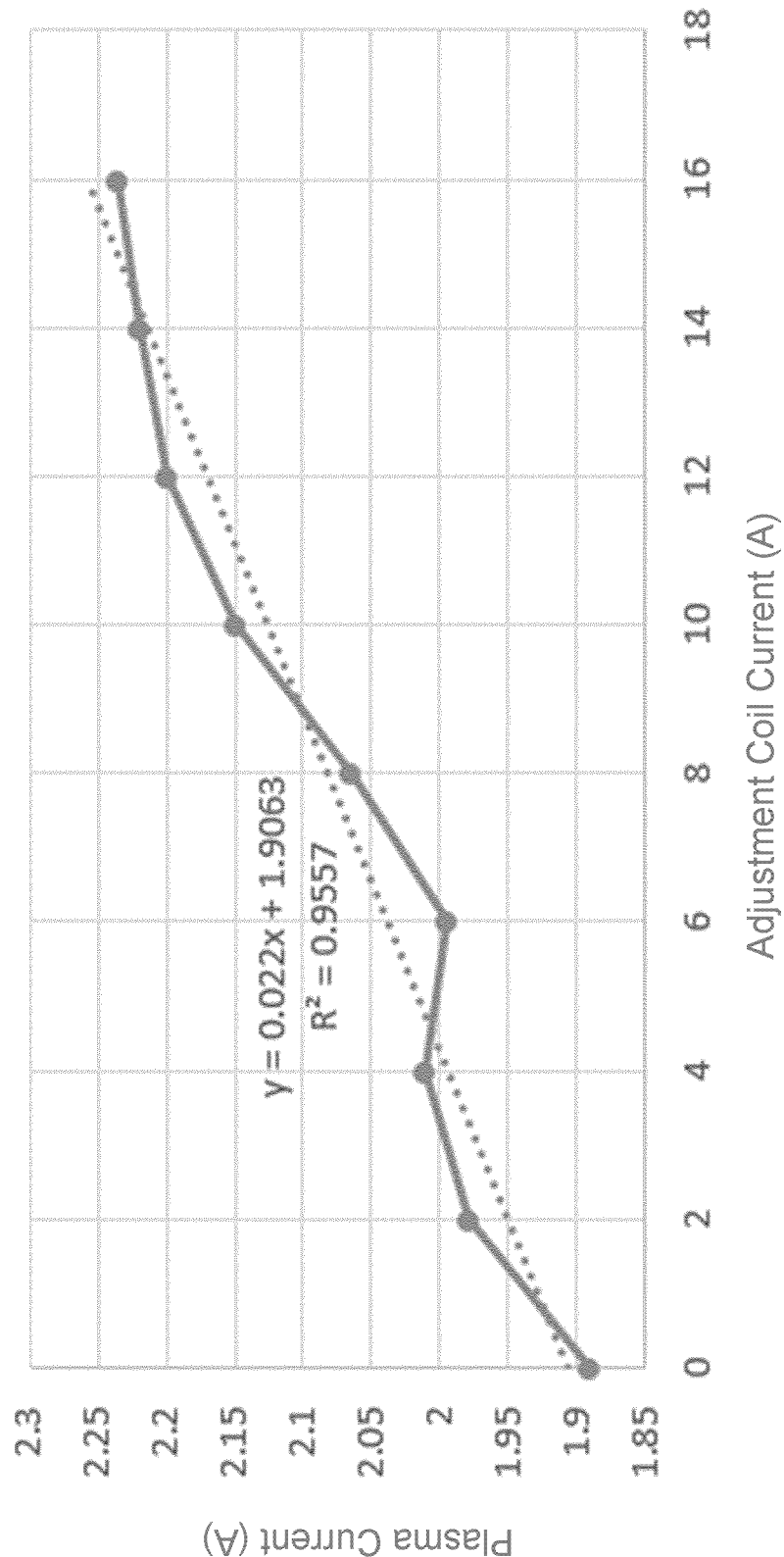
FIG. 7 is a graph that shows how the effect of the current through a coil acting as a second magnetic field source affects the plasma current at the outlet of the filter.

FIG. 7 shows the effect of increasing the current (and therefore magnetic field strength) in the adjustment coil on the plasma current at the filter outlet (a measure of the amount of plasma reaching the coating chamber). As can be seen, increasing the current in the adjustment coil increases the plasma efficiency of the filter.

Figure 8B:
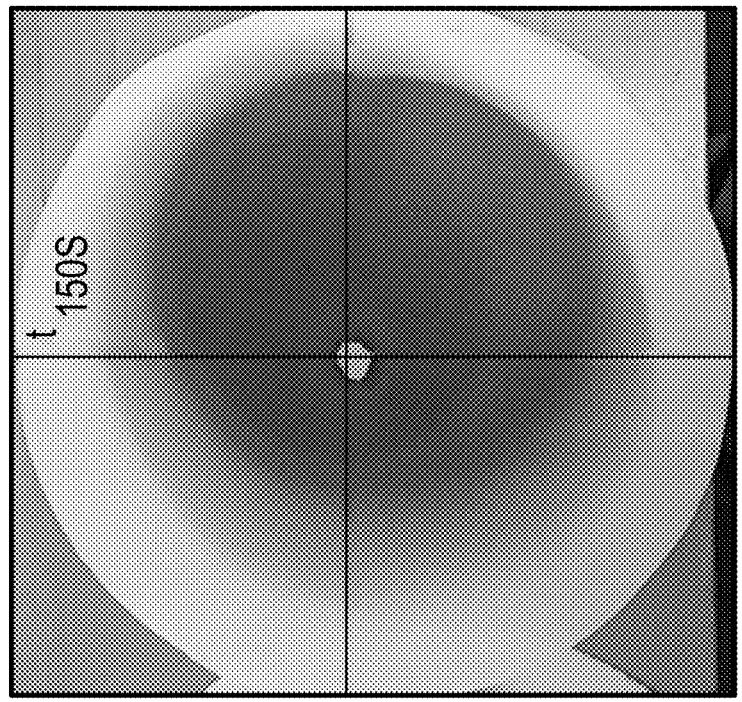
FIGS. 8A and 8B are photographs of paper discs placed at the outlet of filters attached to cathode arc sources. For FIG. 8A, the filter was not fitted with an adjustment coil. For FIG. 8B, the filter was fitted with an adjustment coil.
Figure 8A:
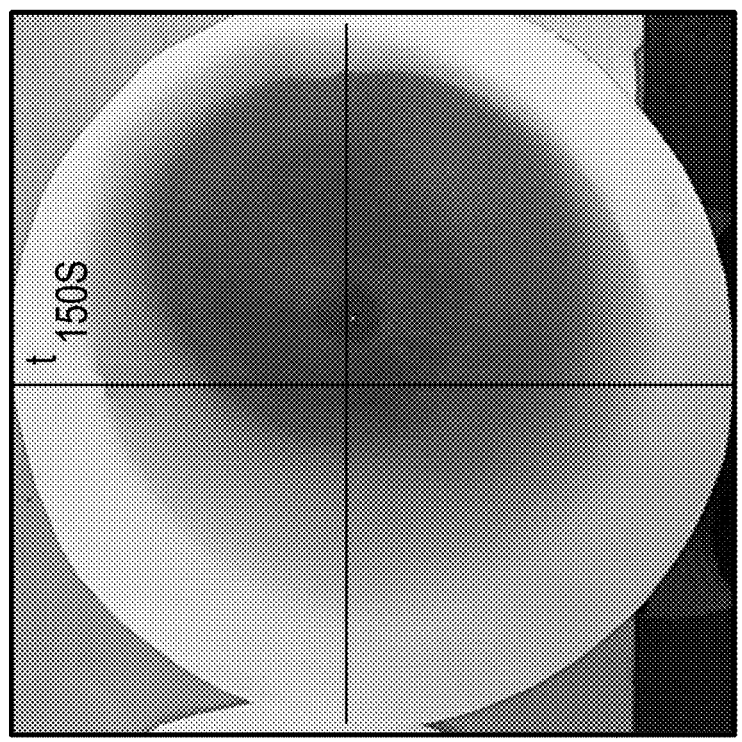

When a disc of paper is located at the filter duct outlet, a position of the plasma beam can be seen by the position of a hole caused by the plasma beam burning through the paper. FIG. 8A shows a disc of paper placed at an outlet of a filter with no adjustment coil. As can be seen, the hole (which indicates the position of the plasma beam) is right of centre). By contrast, FIG. 8B shows a disc of paper placed at an outlet of a filter was an adjustment coil fitted wherein the adjustment coil current is 16 A. Here is can be seen that the hole (which indicated the position of the plasma beam) is central with respect to the filter outlet.

Figure 9:
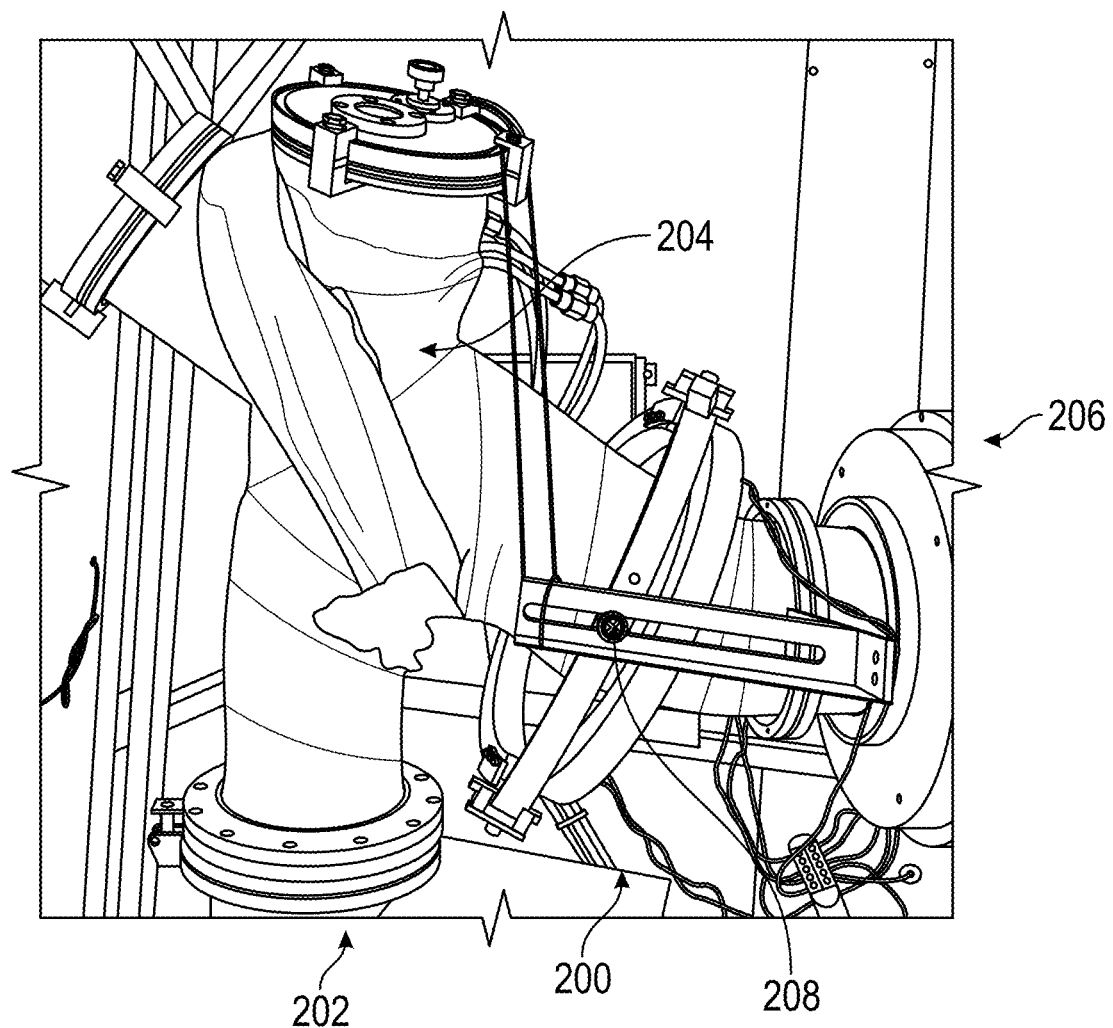
FIG. 9 shows a third embodiment of the invention which comprises a conventional FCVA apparatus with an "X-bend" filter fitted with adjustment coil.

FIG. 9 shows an alternative "X-bend" filter arrangement to FIG. 2. FIG. 9 shows a conventional FCVA deposition apparatus with an "X-bend" filter. Similarly to FIG. 2, the apparatus in FIG. 2 (200) comprises a cathode arc source (202) and a coating chamber (206). The cathode arc source (202) and coating chamber (206) are connected by an X-bend filter duct (204). By contrast to the apparatus shown in FIG. 2, the X-bend filter duct (204) has mounted downstream (i.e. closer to the coating chamber (206)) of the bend an adjustment coil (208).

As described above, the adjustment coil is used to centre the plasma beam with respect to the coating chamber inlet/filter duct outlet and thereby improve coating efficiency of cathode arc deposition apparatuses. Tetrahedral amorphous carbon (ta-C) was deposited onto a silicon wafer using an X-bend filter-containing FCVA apparatus for a period of 4000 seconds with and without the adjustment coil. The ta-C coating thickness was measured over 17 points and the average thickness is shown in the table below.

| Apparatus | Average Thickness (Å) | Percentage |
|---|---|---|
| X-bend FCVA without adjustment coil | 1498 | 100% |
| X-bend FCVA with adjustment coil | 2264 | 151% |

When the plasma beam exiting the filter duct was scanned over an area to be coated, a similar increase in coating thickness was observed (approximately a 50% increase) with a comparable uniformity of coating from the scanning process (see FIG. 10).

Hence, the invention provides an improved cathodic arc source filter with improved plasma efficiency.

The invention claimed is:

1. A filter for a cathode arc source, said filter comprising:
a filter duct having two bends, and
a first magnetic field source for steering plasma through the filter duct for removal of macroparticles from the plasma, wherein the first magnetic field source comprises a coil of a conducting material wrapped around the filter duct along 50% or greater of its length;
wherein the filter comprises a second magnetic field source which is rotatably mounted surrounding a portion of the filter duct between the two bends.

2. A filter for a cathode arc source, said filter comprising:
a filter duct having a bend of an angle of greater than 90°, and
a first magnetic field source for steering plasma through the filter duct for removal of macroparticles from the plasma, wherein the first magnetic field source comprises a coil of a conducting material wrapped around the filter duct along 50% or greater of its length;
wherein the filter comprises a second magnetic field source which is rotatably mounted surrounding a portion of the filter duct downstream of the bend.

3. A filter according to claim 1, wherein the second magnetic field source is annular in shape.

4. A filter according to claim 1, wherein the second magnetic field source is a coil of an electrically conducting material.

5. A filter according to claim 1, wherein the second magnetic field source is rotatable along two axes.

6. A filter according to claim 1, wherein the second magnetic field source provides a magnetic field of strength of from 3 mT to 15 mT.

7. A filter according to claim 1, wherein the second magnetic field source provides a magnetic field of strength from 20% to 35% of the strength of the magnetic field from the first magnetic field source.

8. A filter according to claim 1, wherein the two bends are in different planes.

9. A filter according to claim 1, wherein the second magnetic field source is mounted on the filter duct in a manner that allows it to be rotated about an axis perpendicular to the axis of the filter duct at the portion of the filter duct where the second magnetic field source surrounds the filter duct.

10. A filter according to claim 9, wherein the second magnetic field source is mounted on the filter duct in a manner that allows it to be rotated independently about two axes perpendicular to the axis of the filter duct at the portion of the filter duct where the second magnetic field source surrounds the filter duct.

11. A filter according to claim 1, wherein the filter duct has a single inlet for connecting to a cathode arc source and a single outlet for connecting to a coating chamber.

12. A filter according to claim 1, wherein the filter duct has a baffle in the form of a disc having a substantially circular aperture at an outlet end, wherein the baffle extends across the width of the filter duct.

13. A cathode arc source for depositing a coating on a substrate said source comprising
an anode and a cathode station for a target; and
a filter as defined in claim 1.

14. A cathodic vacuum arc deposition apparatus comprising two or more cathode arc sources as defined in claim 13.

15. The cathodic vacuum arc deposition apparatus of claim 14, comprising four cathode arc sources.

16. The cathodic vacuum arc deposition apparatus of claim 14, comprising six cathode arc sources.

* * * * *